(12) United States Patent
Kitamura et al.

(10) Patent No.: US 10,325,805 B2
(45) Date of Patent: Jun. 18, 2019

(54) METHOD FOR MANUFACTURING A SEMICONDUCTOR DEVICE

(71) Applicant: KABUSHIKI KAISHA TOSHIBA, Minato-ku, Tokyo (JP)

(72) Inventors: Masayuki Kitamura, Yokohama (JP); Atsuko Sakata, Yokohama (JP); Makoto Wada, Yokohama (JP); Yuichi Yamazaki, Inagi (JP); Masayuki Katagiri, Kawasaki (JP); Akihiro Kajita, Yokohama (JP); Tadashi Sakai, Yokohama (JP); Naoshi Sakuma, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/651,476

(22) Filed: Jul. 17, 2017

(65) Prior Publication Data

US 2017/0316973 A1 Nov. 2, 2017

Related U.S. Application Data

(62) Division of application No. 13/622,089, filed on Sep. 18, 2012, now abandoned.

(30) Foreign Application Priority Data

Feb. 22, 2012 (JP) .................................. 2012-036377

(51) Int. Cl.
*H01L 21/02* (2006.01)
*H01L 21/768* (2006.01)
*H01L 23/532* (2006.01)

(52) U.S. Cl.
CPC .. *H01L 21/76846* (2013.01); *H01L 21/02373* (2013.01); *H01L 21/76855* (2013.01);
(Continued)

(58) Field of Classification Search
None
See application file for complete search history.

(56) References Cited

U.S. PATENT DOCUMENTS 3,667,110 A * 6/1972 Gwyn, Jr. ............... B23K 20/24
228/193
2003/0072975 A1* 4/2003 Shero ..................... C23C 16/308
428/704
(Continued)

FOREIGN PATENT DOCUMENTS

JP 9-172077 6/1997
JP 2000-183064 6/2000
(Continued)

OTHER PUBLICATIONS

First Office Action of Japanese Patent Application No. 2012-036377, dated Oct. 14, 2014 (6 pages including translation).

*Primary Examiner* — Charles D Garber
*Assistant Examiner* — Xiaoming Liu
(74) *Attorney, Agent, or Firm* — Finnegan, Henderson, Farabow, Garrett & Dunner, L.L.P.

(57) ABSTRACT

According to one embodiment, a method for manufacturing a semiconductor device is disclosed. The method includes forming a co-catalyst layer and catalyst layer above a surface of a semiconductor substrate. The co-catalyst layer and catalyst layer have fcc structure. The fcc structure is formed such that (111) face of the fcc structure is to be oriented parallel to the surface of the semiconductor substrate. The catalyst includes a portion which contacts the co-catalyst layer. The portion has the fcc structure. An exposed surface of the catalyst layer is planarized by oxidation and reduction treatments. A graphene layer is formed on the catalyst layer.

16 Claims, 16 Drawing Sheets

(52) U.S. Cl.
CPC .. *H01L 21/76858* (2013.01); *H01L 21/76861* (2013.01); *H01L 21/76876* (2013.01); *H01L 23/53276* (2013.01); *H01L 2221/1089* (2013.01); *H01L 2924/0002* (2013.01)

(56) References Cited

U.S. PATENT DOCUMENTS

| | | | |
|---|---|---|---|
| 2010/0021708 A1 | 1/2010 | Kong et al. | |
| 2010/0055464 A1 | 3/2010 | Sung | |
| 2011/0006425 A1* | 1/2011 | Wada | H01L 21/76807 257/750 |
| 2012/0196074 A1* | 8/2012 | Ago | B82Y 30/00 428/64.1 |

FOREIGN PATENT DOCUMENTS

| | | |
|---|---|---|
| JP | 2005-332878 | 12/2005 |
| JP | 2009-070911 | 4/2009 |
| JP | 2009-164432 | 7/2009 |
| JP | 2011-023420 | 2/2011 |

* cited by examiner

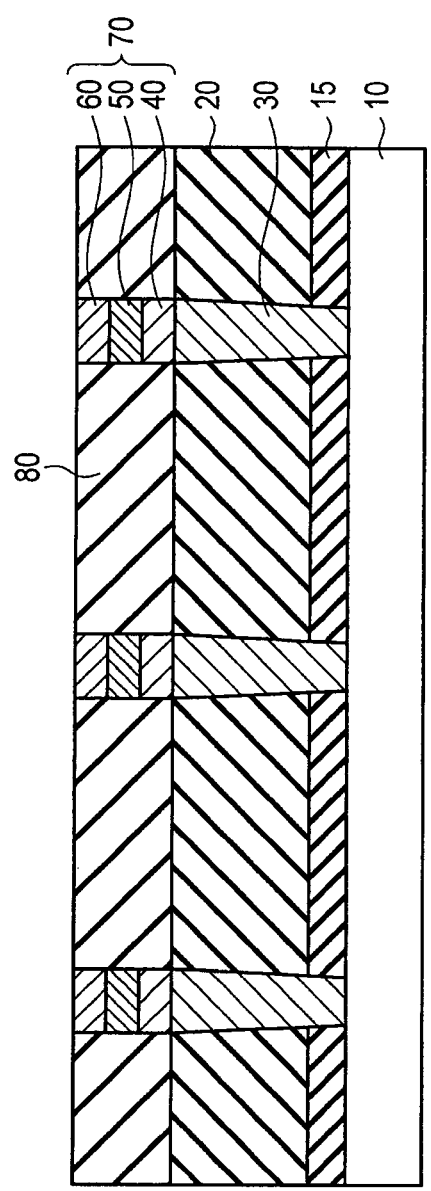
F I G. 1

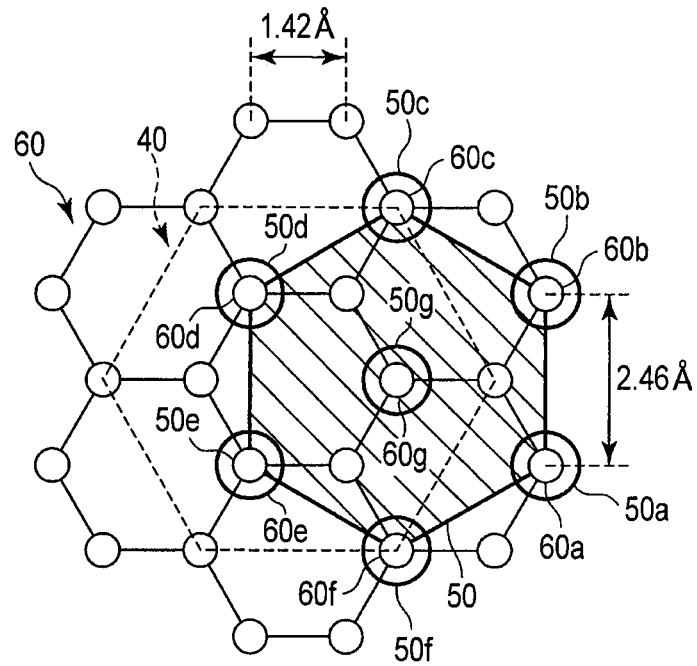
F I G. 9
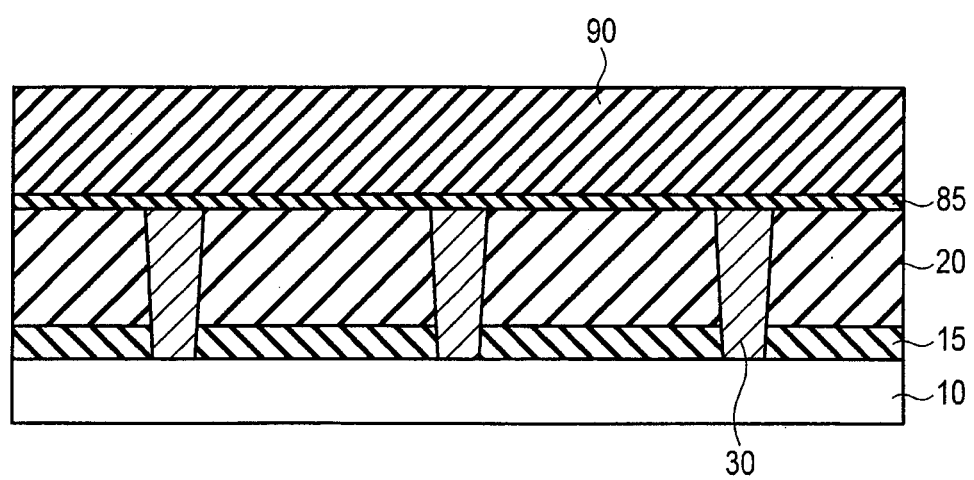
F I G. 10

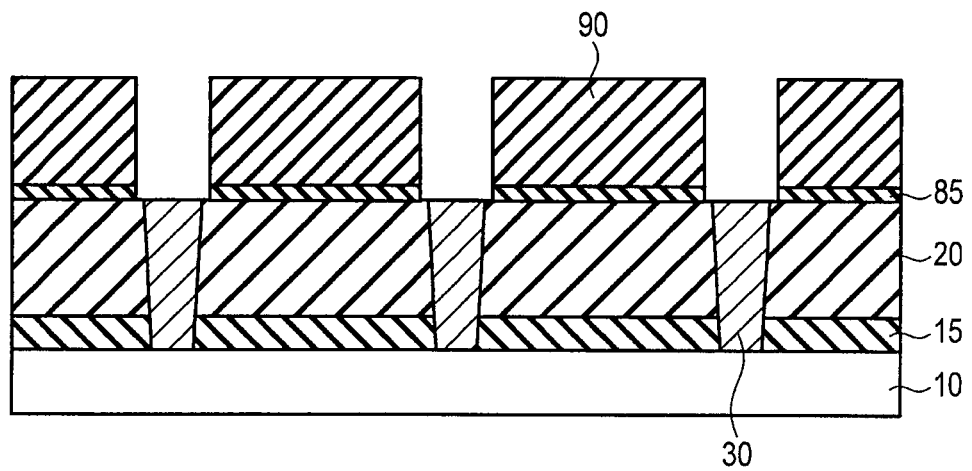
F I G. 11
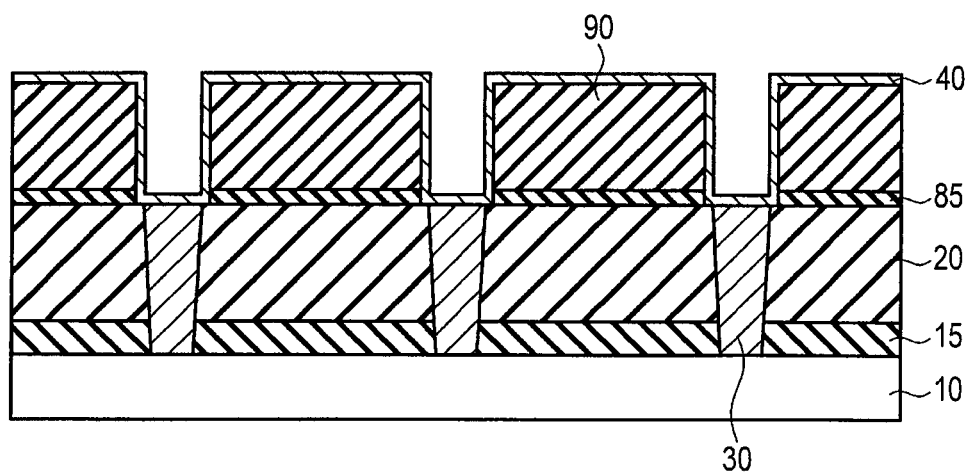
F I G. 12

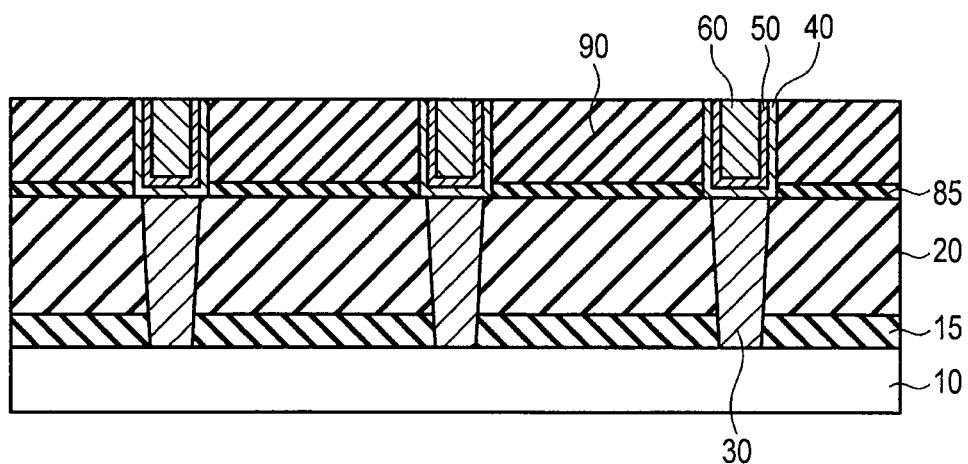
F I G. 19
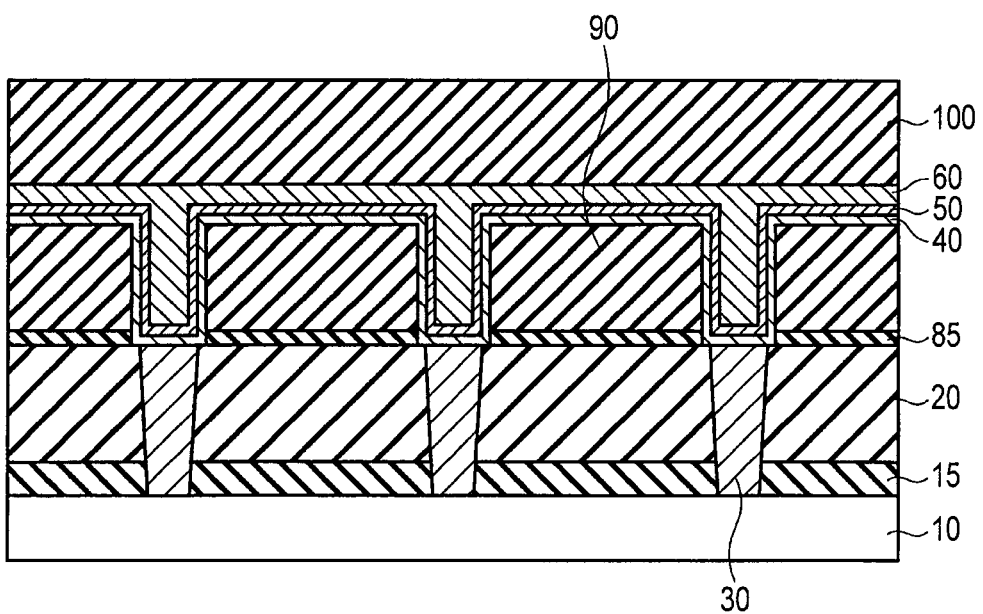
F I G. 20

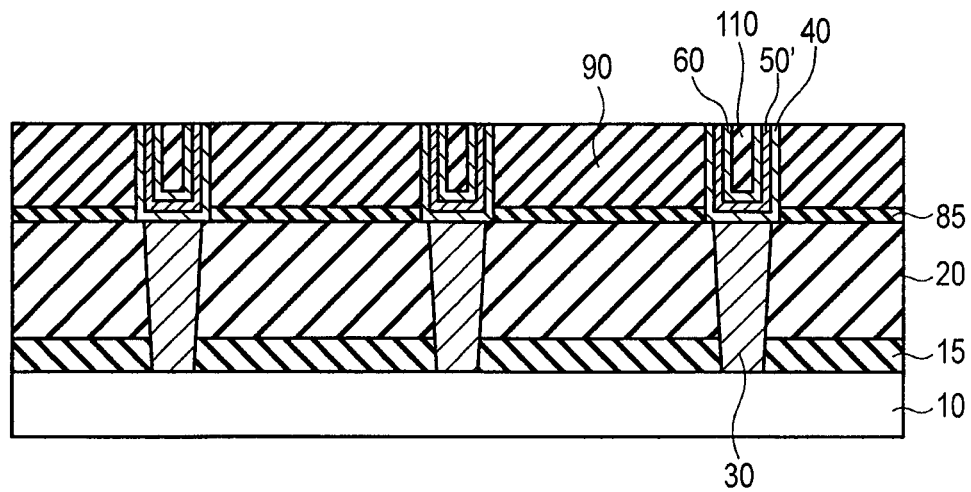
F I G. 25
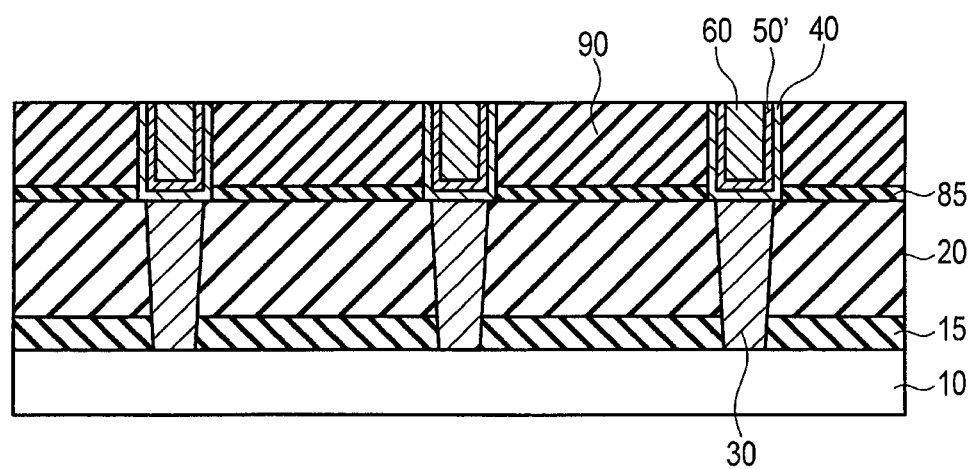
F I G. 26

METHOD FOR MANUFACTURING A SEMICONDUCTOR DEVICE

CROSS-REFERENCE TO RELATED APPLICATIONS

This application is a divisional of U.S. patent application Ser. No. 13/622,089, filed Sep. 18, 2012, which is based upon and claims the benefit of priority from prior Japanese Patent Application No. 2012-036377, filed Feb. 22, 2012, the entire contents of all of which are incorporated herein by reference.

FIELD

Embodiments described herein relate generally to a method for manufacturing a semiconductor device

BACKGROUND

In recent years, the miniaturization of a wiring has advanced in an LSI wiring structure, which arises problems such as an increasing of electric resistivity caused by interfacial inelastic scattering of electrons, an increasing of current density, and a reliability degradation by stress migration or electromigration.

Although copper that is of a low-resistance material is mainly used as an LSI wiring material, the problems still arises with the advance of microfabrication of the wiring structure.

Therefore, it is studied that graphene is used as the LSI wiring material. It is well known that quantized conductance (what is called Ballistic conductance) is generated in the graphene, and the graphene is expected to be an extremely low resistance material as an alternative to the existing metallic material. In the quantized conductance, because the electron is hardly affected by an interfacial scattering effect, the increase in resistance caused by the interfacial scattering effect is hardly generated even in the microfabrication of the wiring structure.

However, for polycrystalline graphene having a small grain diameter, a large number of crystal defects, such as a grain boundary, exist in the graphene. In this case, possibly a wiring resistance increases in the microfabrication of the wiring structure because the electron scatters in crystal defects, such as the grain boundary. Accordingly, there is a need to form the high quality graphene in which the number of crystal defects decreases as few as possible. However, in the related art, growth of the graphene is hardly controlled such that the number of crystal defects decreases.

BRIEF DESCRIPTION OF THE DRAWINGS

FIG. 1 is a sectional view illustrating a configuration of a semiconductor device according to a first embodiment;

FIG. 9 is a conceptual view of the six-membered ring of the catalyst layer and the six-membered ring of the graphene layer formed thereon when the six-membered rings are viewed from above the surface of the semiconductor substrate;

FIG. 10 is a sectional view illustrating the method for manufacturing the semiconductor device following FIG. 6;

FIG. 11 is a sectional view illustrating the method for manufacturing the semiconductor device following FIG. 10;

FIG. 12 is a sectional view illustrating the method for manufacturing the semiconductor device following FIG. 11;

FIG. 19 is a sectional view illustrating the method for forming the damascene wiring following FIG. 18;

FIG. 20 is a sectional view illustrating a damascene wiring forming method using co-catalyst layer and catalyst layer of an embodiment;

FIG. 25 is a sectional view illustrating method for manufacturing a semiconductor device following FIG. 24; and FIG. 26 is a sectional view illustrating another method for manufacturing a semiconductor device.

DETAILED DESCRIPTION

Figure 2:
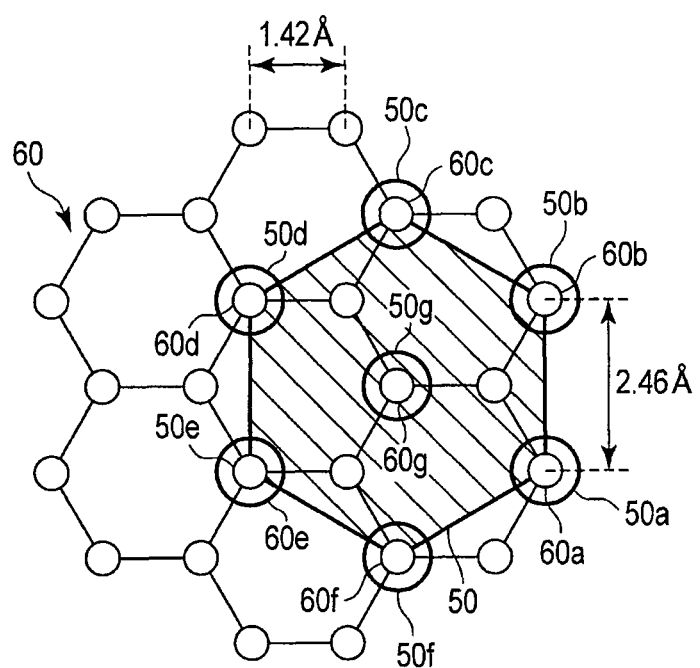
FIG. 2 is a conceptual view of a six-membered ring of a catalyst layer and a six-membered ring of a graphene layer formed thereon when the six-membered rings are viewed from above a surface of the semiconductor substrate.

Hereinafter, embodiments will be described with reference to the drawings.

In general, according to one embodiment, a method for manufacturing a semiconductor device includes forming a co-catalyst layer above a surface of a semiconductor substrate.

The co-catalyst layer includes a face-centered cubic structure or a hexagonal close-packed structure, or an amorphous structure or a microcrystalline structure, wherein the co-catalyst layer is formed such that a (111) face of the face-centered cubic structure or a (002) face of the hexagonal close-packed structure is to be oriented parallel to the surface of the semiconductor when the co-catalyst layer have the face-centered cubic structure or the hexagonal close-packed structure.

The method further includes forming a catalyst layer on the co-catalyst layer. The catalyst layer includes a face-centered cubic structure or a hexagonal close-packed structure, or an amorphous structure or a microcrystalline structure, wherein the catalyst layer is formed such that a (111) face of the face-centered cubic structure or a (002) face of the hexagonal close-packed structure is to be oriented parallel to the surface of the semiconductor when the catalyst layer has the face-centered cubic structure or the hexagonal close-packed structure, the catalyst layer including a portion which contacts the co-catalyst layer, the portion including the face-centered cubic structure or the hexagonal close-packed structure, or the amorphous structure or the microcrystalline structure.

The method further includes planarizing an exposed surface of the catalyst layer by applying an oxidation treatment to the catalyst layer, and by applying a reduction treatment to the catalyst layer to which the oxidation treatment is applied; and forming a graphene layer on the catalyst layer.

First Embodiment

FIG. 1 is a sectional view illustrating a configuration of a semiconductor device according to a first embodiment. In the following drawings, a portion corresponding to an already-described drawing is designated by the same numeral as the already-described drawing, and the detailed description is omitted.

The semiconductor device of the first embodiment comprises a semiconductor substrate 10, inter-layer insulators 15, 20, and 80, a contact plug 30, and a wiring 70. The semiconductor substrate 10 is, for example, a silicon substrate.

The inter-layer insulators 15, 20, and 80 comprises, for example, insulating films such as silicon oxide films or silicon nitride films. The contact plug 30 is, for example, made of conductive materials such as copper, tungsten, or aluminum. The contact plug 30 penetrates the inter-layer insulators 15 and 20 to contact the semiconductor substrate 10.

The wiring 70 is a stacked film of a co-catalyst layer 40, a catalyst layer 50, and a graphene layer 60. The co-catalyst layer 40 is provided on the inter-layer insulator 20 and the contact plug 30, which are provided on a surface of the semiconductor substrate 10. The co-catalyst layer 40 is made of a material having a face-centered cubic structure, or a hexagonal close-packed structure.

For example, the co-catalyst layer 40 is a single-layer film made of a material selected from a group consisting of Ti, Cu, Zn, Zr, Ru, Rh, Pd, Ag, Hf, Re, Ir, Pt, and Au, a single-layer film made of a nitride of the material selected from the group, a single-layer film made of an alloy containing at least two materials selected from the group, or a stacked film made of at least two materials selected from a group consisting of Ti, Cu, Zn, Zr, Ru, Rh, Pd, Ag, Hf, Re, Ir, Pt, Au, a nitride thereof, and an alloy containing at least the two above metals.

For example, TiN, Cu, and Pt have a face-centered cubic structure, and Ti, Zn, and Ru have a hexagonal close-packed structure. Further, a TaN film can be used as the co-catalyst layer 40. Films containing the following metallic materials may be used as the co-catalyst layer 40.

For example, the co-catalyst layer 40 is a stacked film of a TiN film (upper layer) and the TaN film (lower layer), a stacked film of the TiN film (upper layer) and a Ti film (lower layer), a stacked film including an Ir layer as the uppermost layer, a Ti single-layer film, a TiN single-layer film, and a TaN single-layer film. Those films are formed by PVD (Physical Vapor Deposition) method or CVD (Chemical Vapor Deposition) method. The upper layer is a layer close to the catalyst layer 50 and the graphene layer 60, and the lower layer is a layer close to the semiconductor substrate 10.

In the case that the co-catalyst layer 40 has the face-centered cubic structure while a (111) plane of the co-catalyst layer 40 is oriented so as to be parallel to the surface of the semiconductor substrate 10, or in the case that the co-catalyst layer 40 has the hexagonal close-packed structure while a (002) plane of the co-catalyst layer 40 is oriented so as to be parallel to the surface of the semiconductor substrate 10, the catalyst layer 50 is oriented such that the (111) plane of the face-centered cubic structure, or the (002) plane of the hexagonal close-packed structure is parallel to the surface of the semiconductor substrate 10.

The catalyst layer 50 is provided on the co-catalyst layer 40, and made of a material having the face-centered cubic structure, or the hexagonal close-packed structure. For example, the catalyst layer 50 is a single-layer film made of a material selected from a group consisting of Ni, Co, and Fe, a single-layer film made of a nitride of the material selected from the group, a single-layer film made of an alloy containing at least two materials selected from the group, or a stacked film containing at least two films made of different materials selected from a group consisting of Ni and a nitride thereof, Co and a nitride thereof, and Fe and a nitride thereof.

In the case that the co-catalyst layer 40 has the face-centered cubic structure while the (111) plane of the co-catalyst layer 40 is oriented so as to be parallel to the surface of the semiconductor substrate 10, or in the case that co-catalyst layer 40 has the hexagonal close-packed structure while the (002) plane of the co-catalyst layer 40 is oriented so as to be parallel to the surface of the semiconductor substrate 10, the catalyst layer 50 is oriented such that the (111) plane of the face-centered cubic structure, or the (002) plane of the hexagonal close-packed structure is parallel to the surface of the semiconductor substrate 10. Thereby, a graphene layer having a small number of crystal defects and a large crystal grain can be formed on the catalyst layer 50.

It is not necessary that the whole co-catalyst layer 40 have the face-centered cubic structure, or the hexagonal close-packed structure. In the co-catalyst layer 40, at least a portion that contacts the catalyst layer 50 may have the face-centered cubic structure, or the hexagonal close-packed structure. For example, the co-catalyst layer 40 may be a stacked film of the TaN film (upper layer) and the Ta film (lower layer).

The wiring 70 extends in a plane parallel to the surface of the semiconductor substrate 10. The contact plug 30 penetrates the inter-layer insulators 15 and 20 to electrically connect the semiconductor substrate 10 and the wiring 70. A gap between the contact plugs 30 adjacent to each other is filled with the inter-layer insulators 15 and 20. A gap between the wirings 70 adjacent to each other is filled with the inter-layer insulator 80.

Because the graphene is hardly affected by the interfacial scattering by virtue of the quantized conductance, the resistance increase caused by the interfacial scattering effect is not generated. Further, the graphene has an excellent heat-resistant property, and the graphene can be applied to a semiconductor manufacturing process at a high temperature that other metallic materials cannot withstand.

It is considered that the graphene having the low resistance and the excellent heat-resistant property is suitable for the wiring of the LSI device. For example, the co-catalyst layer and the catalyst layer, which are necessary for growth of the graphene, are deposited after a surface portion of the lower-layer wiring is planarized. Then the graphene layer may be grown on the catalyst layer.

However, it is well known that crystallinity of the graphene layer depends heavily on the catalyst layer which is an underlying layer of the graphene layer. As described above, in the polycrystalline graphene having the small grain diameter, the electron scatters at the grain boundary, and the resistance increases.

In the present embodiment, the surface (the face parallel to the surface of the semiconductor substrate 10) of the catalyst layer 50 is set to the (111) plane of the face-centered cubic structure, or the (002) plane of the hexagonal close-packed structure. That is, the surface on which the graphene is deposited is set to the (111) plane of the face-centered cubic structure, or the (002) plane of the hexagonal close-packed structure.

As illustrated in FIG. 2, the (111) plane of the face-centered cubic structure, or the (002) plane of the hexagonal close-packed structure has a structure similar to a crystal structure of the graphene.

FIG. 2 is a conceptual view of a six-membered ring of the catalyst layer 50 and a six-membered ring of the graphene layer 60 formed thereon when the six-membered rings are viewed from above the surface of the semiconductor substrate 10. As illustrated in FIG. 2, atoms 50a to 50g constituting the six-membered ring of the catalyst layer 50 overlap positions of atoms 60a to 60g in atoms constituting three six-membered rings of the graphene layer 60. Accordingly, it is found that the graphene layer 60 having a small number of crystal defects is easily formed on the catalyst layer 50.

Table 1 illustrates a lattice mismatch degree between the catalyst layer 50 and the graphene layer 60 with respect to various materials for the catalyst layer 50. The lattice mismatch degree is defined as follows.

Assuming that A (reference) is a distance (about 0.246 nm) between second near neighbor atoms of the six-membered ring in the graphene layer 60 and B is a distance between near neighbor atoms of the (111) plane of the face-centered cubic structure, or the (002) plane of the hexagonal close-packed structure of the catalyst layer 50, the lattice mismatch degree is defined as 100(B−A)/A [%].

TABLE 1

| | Crystal structure measurement | Direction | Distance between neighboring atoms B | Lattice mismatch degree |
|---|---|---|---|---|
| Ni | fcc | (111) | 0.2491 | 1.10% |
| CoNi$_3$ | fcc | (111) | 0.2495 | 1.26% |
| Co | hcp | (002) | 0.2497 | 1.34% |
| Cu$_{0.87}$Si$_{0.13}$ | hcp | (002) | 0.2507 | 1.75% |
| Mn$_{0.3}$Fe$_{0.7}$ | hcp | (002) | 0.252 | 2.27% |
| Co | fcc | (111) | 0.2521 | 2.31% |

TABLE 1-continued

| | Crystal structure measurement | Direction | Distance between neighboring atoms B | Lattice mismatch degree |
|---|---|---|---|---|
| Cu | fcc | (111) | 0.2556 | 3.73% |
| Fe | fcc | (111) | 0.2577 | 4.59% |
| TaNi$_3$ | hcp | (002) | 0.2585 | 4.91% |
| RuCo | hcp | (002) | 0.261 | 5.93% |
| Al$_{0.3}$Ge$_{0.7}$ | hcp | (002) | 0.2617 | 6.21% |
| Zn | hcp | (002) | 0.2665 | 8.16% |
| Ru | hcp | (002) | 0.2704 | 9.74% |

Referring to FIG. 2, for example, in the case that Ni is used as the catalyst-layer material, because a difference between the distance (0.249 nm) between the near neighbor atoms of the (111) plane of the face-centered cubic structure and the distance (0.246 nm) between the second near neighbor atoms of the six-membered ring of the graphene layer 60 is as small as about 1.1%, the graphene layer 60 having the small number of crystal defects is easily formed on the catalyst layer 50.

More particularly, for example, a G/D ratio measurement of Raman spectroscopy shows that the graphene layer 60 having the small number of crystal defects is easily formed on the catalyst layer 50 in the case that the difference between the distance between the near neighbor atoms of the catalyst layer 50 and the distance between the second near neighbor atoms of the six-membered ring of the graphene layer 60 is less than or equal to 9%, desirably 5%. On the other hand, the graphene having a sufficient domain was not able to be observed on Ru, in which the difference is greater than 9%, from the G/D ratio measurement of the Raman spectroscopy.

For example, the catalyst layer 50 is a single-layer film made of a material selected from a group consisting of Ni, Co, and Fe, a single-layer film made of a nitride of the material selected from the group, a single-layer film made of an alloy containing at least two materials selected from the group, or a stacked film containing at least two films made of different materials selected from a group consisting of Ni and a nitride thereof, Co and a nitride thereof, and Fe and a nitride thereof.

Basically Ni, Co, and Fe that are of the catalyst materials form complete solid solution. In an alloy containing at least two kinds of catalyst elements, a whole interatomic distance of the alloy can be controlled. Accordingly, the graphene can well be grown by use of the catalyst layer containing at least two kinds of catalyst elements.

Figure 3A:
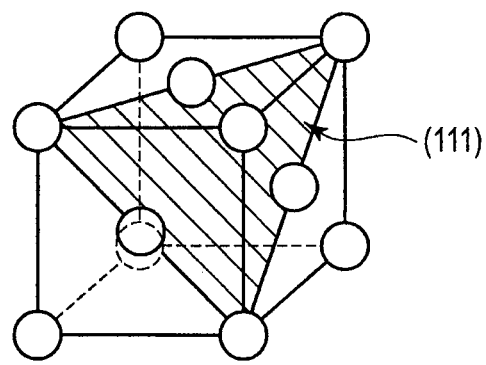
FIG. 3A is an explanatory view illustrating a (111) plane of a face-centered cubic structure.
Figure 3B:
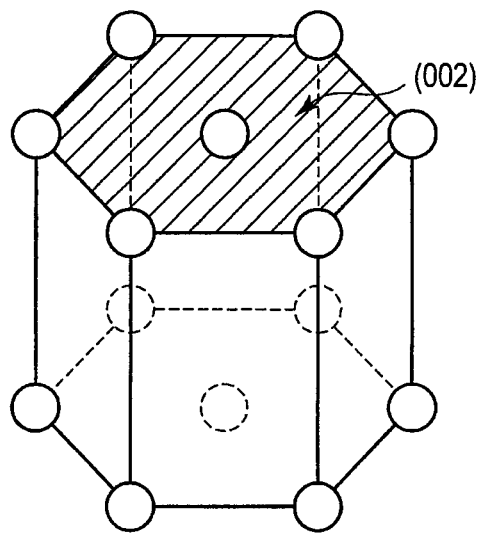
FIG. 3B is an explanatory view illustrating a (002) plane of a hexagonal close-packed structure.

FIG. 3A is an explanatory view illustrating the (111) plane of the face-centered cubic structure, and FIG. 3B is an explanatory view illustrating the (002) plane of the hexagonal close-packed structure. The (111) plane of the face-centered cubic structure is identical to the (002) plane of the hexagonal close-packed structure in an atomic arrangement. This can be seen when the (002) plane in FIG. 2 is extended to consider a lattice arrangement in a long period.

According to the present embodiment, the co-catalyst layer 40 has the (111) plane of the face-centered cubic structure, or the (002) plane of the hexagonal close-packed structure, and the (111) plane or the (002) plane is parallel to the surface of the semiconductor substrate 10. Thereby, the upper surface of the co-catalyst layer 40, on which the catalyst layer 50 is deposited, constitutes the (111) plane of the face-centered cubic structure, or the (002) plane of the hexagonal close-packed structure, the (111) plane of the catalyst layer 50 is oriented in parallel to the surface of the semiconductor substrate 10 in the case that the catalyst layer 50 has the face-centered cubic structure, and the (002) plane of the catalyst layer 50 is oriented in parallel to the surface of the semiconductor substrate 10 in the case that the catalyst layer 50 has the hexagonal close-packed structure.

Further, the upper surface of the catalyst layer 50, on which the graphene layer 60 is deposited, constitutes the (111) plane of the face-centered cubic structure, or the (002) plane of the hexagonal close-packed structure. Therefore, the graphene layer 60 having the small number of crystal defects may easily be grown on the catalyst layer 50.

Similarly to the conceptual view in FIG. 2, FIG. 9 illustrates the co-catalyst layer in the stacked structure. As can be seen from FIG. 9, the better orientation is obtained because of a good lattice matching degree among the co-catalyst layer, the catalyst layer, and the graphene layer.

Table 2 illustrates a lattice mismatch degree between the co-catalyst layer 40 and the graphene layer 60 with respect to various materials for the co-catalyst layer 40. The lattice mismatch degree is defined as follows.

Assuming that A' (reference) is a distance (about 0.285 nm) between third near neighbor atoms of the six-membered ring of the graphene layer 60 and B' is a distance between the near neighbor atoms of the (111) plane of the face-centered cubic structure, or the (002) plane of the hexagonal close-packed structure of the co-catalyst layer 40, the lattice mismatch degree is defined as 100(B'−A')/A' [%].

TABLE 2

| Crystal structure measurement | Direction | Distance between neighboring atoms B' | Lattice mismatch degree |
|---|---|---|---|
| WN | fcc | (111) | 0.2491 | 1.10% |
| Ti | fcc | (111) | 0.2495 | 1.26% |
| TiO$_{0.2}$ | hcp | (002) | 0.2497 | 1.34% |
| TiN | hcp | (002) | 0.2507 | 1.75% |
| TaN | hcp | (002) | 0.252 | 2.27% |
| TaO | fcc | (111) | 0.2521 | 2.31% |

The lattice mismatch degrees between the co-catalyst layers made of the materials in Table 2 and the graphene layer are less than or equal to 10%, and sometimes the lattice mismatch degree is less than or equal to 4% in some materials. The higher-quality (less defective) graphene layer can be obtained by reducing not only the lattice mismatch degree between the co-catalyst layer and the graphene layer but also the lattice mismatch degree between the co-catalyst layer and the graphene layer. Thereby, the wiring (graphene wiring) including the lower-resistance graphene layer can be formed.

Figure 4:
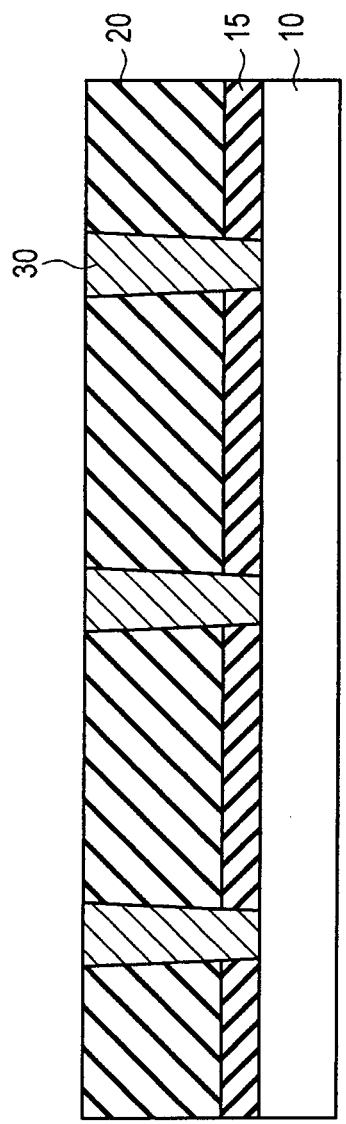
FIG. 4 is a sectional view illustrating a method for manufacturing a semiconductor device according to the first embodiment.
Figure 5:
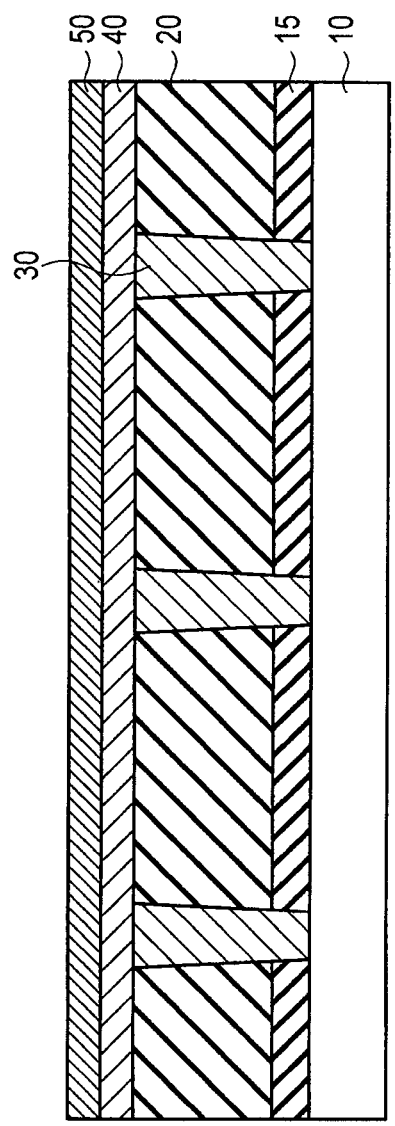
FIG. 5 is a sectional view illustrating the method for manufacturing the semiconductor device following FIG. 4.
Figure 6:
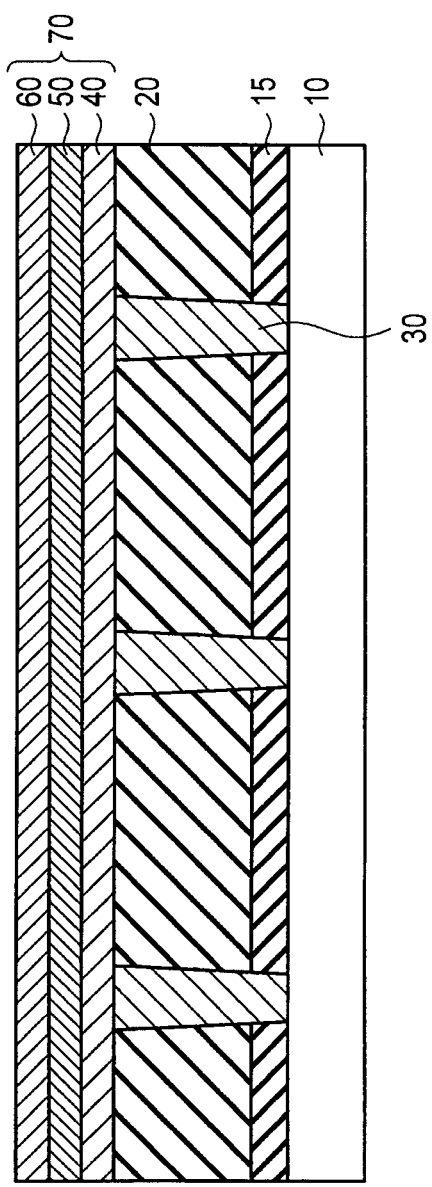
FIG. 6 is a sectional view illustrating the method for manufacturing the semiconductor device following FIG. 5.

FIGS. 4 to 6 are sectional views illustrating a method for manufacturing a semiconductor device according to the first embodiment.

At first, semiconductor elements (not illustrated), such as a transistor and a capacitor, are formed on the semiconductor substrate 10. Then the inter-layer insulators 15 and 20 are deposited on the semiconductor substrate 10. For example, the inter-layer insulators 15 and 20 are a TEOS (Tetra Ethyl Ortho Silicate) film. Then the contact plug 30 is formed so as to penetrate the inter-layer insulators 15 and 20 to contact the semiconductor substrate 10.

The material of contact plug 30 is, for example, copper, tungsten, and aluminum. The contact plug 30 is polished by a CMP (Chemical Mechanical Polishing) method until the upper surface of the inter-layer insulator 20 is exposed. Thereby, the structure in FIG. 4 is obtained.

The co-catalyst layer (not illustrated) may be formed between the contact plug 30 and the semiconductor substrate 10 in order to prevent a metal used for the contact plug 30 from diffusing into the semiconductor substrate 10. The material of the co-catalyst layer may be, for example, Ta, Ti, Ru, Mn, Co, and a nitride thereof.

Then, the wiring including the graphene layer 60 is formed on the contact plug 30 and the inter-layer insulator 20.

First, by using the PVD method or the CVD method, the TaN film having thicknesses of about 1 nm to 20 nm is deposited as the co-catalyst layer 40 on the inter-layer insulator 20 and the contact plug 30.

As described above, the co-catalyst layer 40 may be the single-layer film made of a material selected from the group consisting of Ti, Cu, Zn, Zr, Ru, Rh, Pd, Ag, Hf, Re, Ir, Pt, and Au, the single-layer film made of the nitride of the material selected from the group, the single-layer film made of the alloy containing at least two materials selected from the group, or the stacked film made of at least two materials selected from a group consisting of Ti, Cu, Zn, Zr, Ru, Rh, Pd, Ag, Hf, Re, Ir, Pt, Au, a nitride thereof, and the alloy containing at least the two above metals.

Further, the film containing the following metallic materials may be used as the co-catalyst layer 40. For example, the co-catalyst layer 40 is a stacked film of the TaN film (upper layer) and the Ta film (lower layer), a stacked film of the TiN film (upper layer) and the TaN film (lower layer), a stacked film of the TiN film (upper layer) and the Ti film (lower layer), a stacked film in which the Ir film is included in the uppermost layer (for example, a stacked film including the Ta film, the Ru film, and the Ir film lower from the lower layer), a stacked film of the Ta film and the Ru film, a Ti single-layer film, a TiN single-layer film, or a TaN single-layer film. The films are formed by PVD method or CVD method.

Those materials have the face-centered cubic structure, or the hexagonal close-packed structure. Accordingly, from the viewpoint of surface energy, the co-catalyst layer 40 is deposited on the inter-layer insulator 20 and the contact plug 30 such that the (111) plane of the face-centered cubic structure, or the (002) plane of the hexagonal close-packed structure, which is of a close-packed surface, is oriented in parallel to the surface of the semiconductor substrate 10.

Then, by using PVD method, Co having thicknesses of about 1 nm to 50 nm is deposited as the material for the catalyst layer 50 on the co-catalyst layer 40. As described above, the catalyst layer 50 may be the single-layer film made of the material selected from the group consisting of Ni, Co, and Fe, the single-layer film made of the nitride of the material selected from the group, the single-layer film made of the alloy containing at least two materials selected from the group, or the stacked film containing at least two films made of different materials selected from a group consisting of Ni and the nitride thereof, Co and the nitride thereof, and Fe and the nitride thereof.

The materials have the face-centered cubic structure, or the hexagonal close-packed structure. Accordingly, the catalyst layer 50 is also deposited such that the (111) plane of the face-centered cubic structure, or the (002) plane of the hexagonal close-packed structure is oriented in parallel to the surface of the semiconductor substrate 10. At this point, the co-catalyst layer 40 is deposited such that the (111) plane of the face-centered cubic structure, or the (002) plane of the hexagonal close-packed structure is oriented in parallel to the surface of the semiconductor substrate 10. Therefore, the catalyst layer 50 in which the (111) plane of the face-centered cubic structure, or the (002) plane of the hexagonal close-packed structure is strongly oriented in parallel to the surface of the semiconductor substrate 10 than ever before can be obtained. As a result, the structure in FIG. 5 is obtained.

Thus, in the present embodiment, by using the co-catalyst layer 40 in which the (111) plane of the face-centered cubic structure, or the (002) plane of the hexagonal close-packed structure is oriented so as to be parallel to the surface of the semiconductor substrate 10, the catalyst layer 50 can intentionally be oriented such that the (111) plane of the face-centered cubic structure, or the (002) plane of the hexagonal close-packed structure of the catalyst layer 50 is parallel to the surface of the semiconductor substrate.

Then, as illustrated in FIG. 6, the graphene layer 60 is grown on the catalyst layer 50. The forming of the graphene layer 60 is performed, for example, by using CVD method. As the source of carbon in the CVD method, hydrocarbon system gas such as methane, acetylene, or mixed gases thereof may be used, and hydrogen or rare gases are used as a carrier gas. As to a temperature at which the graphene layer 60 is formed, an upper limit is about 1000° C. and a lower limit is about 200° C. The forming temperature is, for example, about 600° C. In order to remove ions and electrons by using remote plasma, an electrode may be placed above the semiconductor substrate 10 to apply a voltage. The applied voltage for forming the graphene layer 60 is in a range of 0 to ±100 V.

A metallic film or an insulating film may be formed as a protective film on the graphene layer 60. For example, the metallic film is formed by a sputtering method. For example, the insulating film is formed by CVD method or application method.

Thereafter, by using lithography technique and RIE (Reactive Ion Etching) method, the graphene layer 60, the catalyst layer 50, and the co-catalyst layer 40 are processed to form the wiring 70 in FIG. 1. Further, the material for the inter-layer insulator 80 is deposited by CVD method, and the material for the inter-layer insulator 80 is planarized by CMP method, thereby obtaining the structure in FIG. 1. A multilayer wiring structure may be formed by using the graphene layer. Alternatively, the conventional wiring using W, Cu, Al may be formed on the wiring 70.

Thus, the semiconductor device of the present embodiment is completed.

Figure 7B:
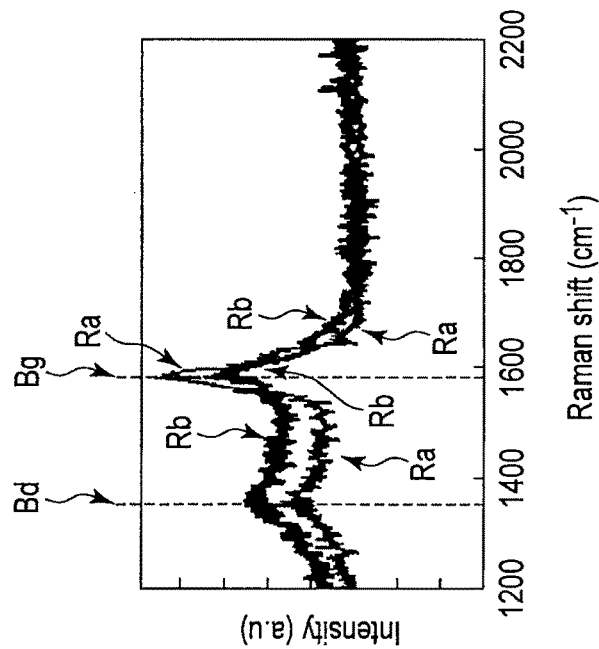
FIG. 7B is a graph illustrating a G/D ratio to a peak height of the (111) plane of the face-centered cubic structure and the (002) plane of the hexagonal close-packed structure by XRD (X-ray Diffraction) method.
Figure 7A:
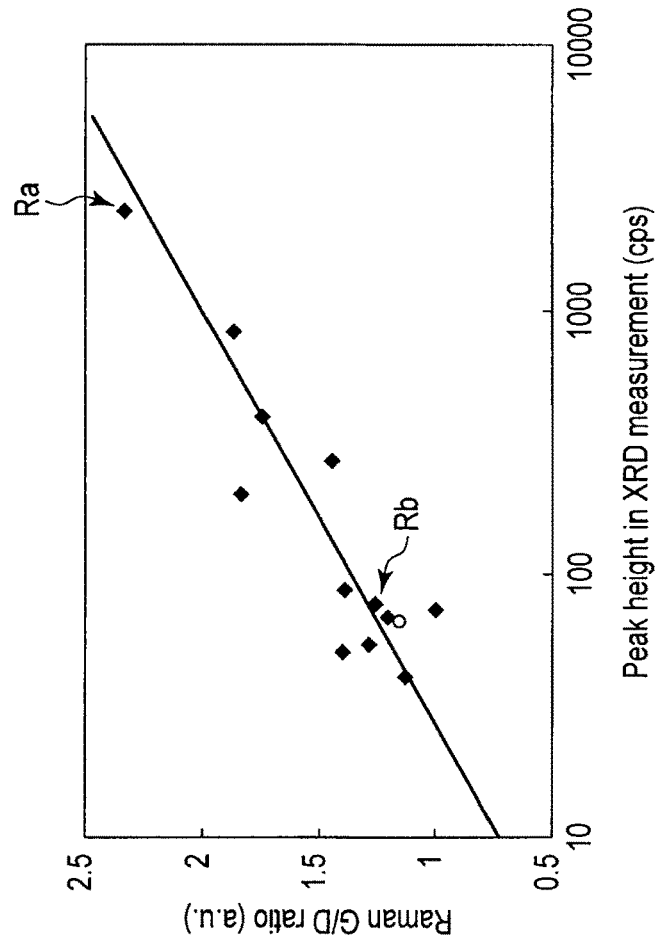
FIG. 7A is a graph illustrating a Raman spectroscopy result of a graphene layer.

FIG. 7A is a graph illustrating a Raman spectroscopy result of the graphene layer 60. FIG. 7B is a graph illustrating a G/D ratio to a peak height of the (111) plane of the face-centered cubic structure, or the (002) plane of the hexagonal close-packed structure of the catalyst layer 50 by XRD (X-ray Diffraction) method.

Peak positions of a D band Bd and a G band Bg are illustrated in the graph in FIG. 7A.

The D band Bd is a band in which emission is generated by the crystal defect of the graphene. The G band Bg is a band in which the emission is generated by the six-membered ring of the graphene.

Accordingly, the defect existing in the graphene (polycrystalline) can be checked by the peak of the D band Bd in Raman spectrum. It can be interpreted that the number of crystal defects existing in the graphene increases with increasing peak of the D band Bd. On the other hand, it can be interpreted that few crystal defects exist in the graphene when the D band Bd has the low peak.

Further, the existence or non-existence of the graphene can be checked by the G band Bg of the Raman spectrum. It can be interpreted that the number of pieces of formed graphene increases with increasing peak of the G band Bg. On the other hand, it can be interpreted that few pieces of graphene exist when the G band Bg has the low peak.

Accordingly, a height ratio between the peaks of the D band Bd and the G band Bg, namely, the G/D ratio is used as one of indicators expressing the quality of the graphene. The G/D ratio is a ratio (G/D) between the peaks of the D band Bd and the G band Bg in the Raman spectrum of a visible Raman spectroscopic analysis with incident light having a wavelength of 532 nm. It is said that the less defective graphene is formed with increasing G/D ratio.

A sample used in the XRD method in FIG. 7B has a structure, in which the co-catalyst layer 40 made of TiN is deposited with thicknesses of about 10 nm to 15 nm, the catalyst layer 50 made of Co is deposited with the thickness of about 30 nm on the co-catalyst layer 40, and the graphene layer 60 is deposited on the catalyst layer 50 by the CVD method.

The (111) plane of the face-centered cubic structure, or the (002) plane of the hexagonal close-packed structure of the catalyst layer 50 of the sample is analyzed by XRD method.

The peak of the (111) plane of the face-centered cubic structure, or the (002) plane of the hexagonal close-packed structure emerges largely, when the (111) plane of the face-centered cubic structure, or the (002) plane of the hexagonal close-packed structure is parallel to the surface of the semiconductor substrate 10, and when the ratio of the (111) plane of the face-centered cubic structure, or the (002) plane of the hexagonal close-packed structure to the plane of the semiconductor substrate 10 increases.

As illustrated in FIG. 7B, the XRD analysis of the catalyst layer 50 shows that the G/D ratio tends to increase with increasing peak height of the (111) plane of the face-centered cubic structure, or the (002) plane of the hexagonal close-packed structure. That is, as the peak height of the (111) plane of the face-centered cubic structure, or the (002) plane of the hexagonal close-packed structure increases in the XRD analysis of the catalyst layer 50, the graphene grown on the catalyst layer 50 is the high quality and less defective. In other words, the graphene layer 60 with high quality is obtained when the (111) plane of the face-centered cubic structure, or the (002) plane of the hexagonal close-packed structure of the catalyst layer 50 is set parallel to the surface of the semiconductor substrate 10.

For example, in the catalyst layer 50 of the sample Rb in FIGS. 7A and 7B, the peak height of the (111) plane of the face-centered cubic structure, or the (002) plane of the hexagonal close-packed structure is less than or equal to 100 cps (counts per second), and the G/D ratio is about 1.2. On the other hand, in the catalyst layer 50 of the sample Ra, the peak height of the (111) plane of the face-centered cubic structure, or the (002) plane of the hexagonal close-packed structure of the catalyst layer 50 is greater than or equal to 1000 cps, and the G/D ratio is about 2.3. Therefore, it is found that the G/D ratio of the graphene layer 60 increases with increasing peak height of the (111) plane of the face-centered cubic structure, or the (002) plane of the hexagonal close-packed structure of the catalyst layer 50.

Desirably the (111) plane of the face-centered cubic structure, or the (002) plane of the hexagonal close-packed structure of the catalyst layer 50 has the peak height sufficiently higher (for example, at least ten times) than other peak heights (for example, the XRD measurement peak caused by the (001) plane of the face-centered cubic structure) of other planes.

According to the present embodiment, the co-catalyst layer 40 has the (111) plane of the face-centered cubic structure, or the (002) plane of the hexagonal close-packed structure, and the (111) plane or the (002) plane is parallel to the surface of the semiconductor substrate 10. Thereby, the (111) plane of the catalyst layer 50 is oriented in parallel to the surface of the semiconductor substrate 10 when the catalyst layer 50 has the face-centered cubic structure, and the (002) plane of the catalyst layer 50 is oriented in parallel to the surface of the semiconductor substrate 10 when the catalyst layer 50 has the hexagonal close-packed structure.

Moreover, the upper surface of the catalyst layer 50 on which the graphene layer 60 is deposited constitutes the (111) plane of the face-centered cubic structure, or the (002) plane of the hexagonal close-packed structure, so that the low-resistivity graphene layer 60 having the small number of crystal defects may easily be grown on the catalyst layer 50.

Therefore, by adopting the structure of co-catalyst/catalyst/graphene of the embodiment, the electron scattering in a defect portion can be suppressed even if the device element further miniaturizes, thereby the semiconductor device comprising a graphene having a high quality with lower resistivity than ever before can be realized.

Second Embodiment

In the first embodiment, the co-catalyst layer 40 is oriented such that the (111) plane of the co-catalyst layer 40 is parallel to the surface of the semiconductor substrate 10 when the co-catalyst layer 40 has the face-centered cubic structure, and the co-catalyst layer 40 is oriented such that the (002) plane of the co-catalyst layer 40 is parallel to the surface of the semiconductor substrate 10 when the co-catalyst layer 40 has the hexagonal close-packed structure.

However, the co-catalyst layer 40 may be made of a metal having neither the face-centered cubic structure nor the hexagonal close-packed structure.

For example, the co-catalyst layer 40 may be a single-layer film made of a material selected from a group consisting of V, Cr, Mn, Nb, Mo, Ta, and W, which have a body-centered cubic structure, a single-layer film made of a nitride of the material selected from the group, a single-layer film made of an alloy containing at least two materials selected from the group, or a stacked film made of at least two materials selected from a group consisting of V, Cr, Mn, Nb, Mo, Ta, W, a nitride thereof, and an alloy containing at least the two above metals. It is noted that WN belongs to the co-catalyst layer 40 of the first embodiment because WN has the face-centered cubic structure, or the hexagonal close-packed structure.

In this case, preferably the co-catalyst layer 40 is in an amorphous shape, namely, an amorphous structure, or a microcrystalline structure. It is not necessary that the whole co-catalyst layer 40 have the amorphous structure, or the microcrystalline structure. In the co-catalyst layer 40, at least a portion that contacts a catalyst layer 50 may have the amorphous structure, or the microcrystalline structure.

Generally, it is well known that a metal preferentially oriented toward a most stable plane in the case that the metal is deposited on the underlying layer having the amorphous structure, or the microcrystalline structure. In the present embodiment, the co-catalyst layer having the amorphous structure, or the microcrystalline structure is formed by utilizing the above characteristic, and the catalyst layer is oriented toward the (111) plane of the face-centered cubic structure, or the (002) plane of the hexagonal close-packed structure. Accordingly, when the catalyst layer 50 has the face-centered cubic structure, or the hexagonal close-packed structure, even if the catalyst layer 50 is deposited on the co-catalyst layer 40 made of the metal having the amorphous structure, or the microcrystalline structure, the (111) plane of the face-centered cubic structure, or the (002) plane of the hexagonal close-packed structure of the catalyst layer 50 may be oriented so as to be parallel to the surface of the semiconductor substrate 10.

Thereby, similarly to the first embodiment, the high quality graphene layer 60 having the high G/D ratio and the small number of crystal defects can be formed on the catalyst layer 50. In the second embodiment, other configurations are identical to those of the first embodiment. In the second embodiment, other manufacturing methods are identical to those of the first embodiment. Accordingly, in the second embodiment, the same effect as the first embodiment can be obtained.

FIGS. 8A to 8E are sectional views illustrating configuration examples of the co-catalyst layer 40 of the first or second embodiments.

Figure 8A:
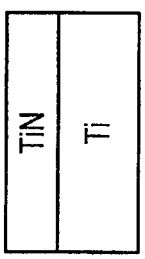
FIGS. 8A, 8B, 8C, 8D, and 8E are sectional views illustrating configuration examples of the co-catalyst layer of first or second embodiments.

FIG. 8A illustrates a stacked film of the Ti film and the TiN film. The Ti film is formed so as to have the hexagonal close-packed structure, and the TiN film is formed so as to have the face-centered cubic structure.

Figure 8B:
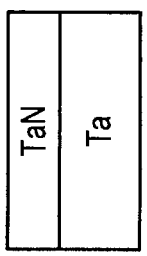

FIG. 8B illustrates a stacked film of the Ta film and the TaN (tantalum nitride) film. A small amount of impurity is mixed in the Ta film in the case that the Ta film is formed by bias sputtering method that is PVD method, or by CVD method. For the CVD method, for example, the small amount of impurity contains carbon in an organic source. As a result, the Ta film having the amorphous structure, or the microcrystalline structure may be formed.

The TaN film having the face-centered cubic structure, or the TaN film having the amorphous structure or the microcrystalline structure may be formed on the Ta film. The latter TaN film will be described in detail below.

TaxNy may be, for example, Ta, $Ta_2N$, and TaN according to a tantalum composition (x) and a nitrogen composition (y). In the case that the TaN film is formed on the Ta film, the TaN film can be formed as a mixed layer containing at least one of Ta, $Ta_2N$, and TaN. Therefore, the TaN film in which at least the upper-surface portion has the amorphous structure, or the microcrystalline structure may be formed on the Ta film. The co-catalyst layer having the above structure may be used. The catalyst layer on the co-catalyst layer is preferentially oriented toward a crystal plane (the (111) plane of the face-centered cubic structure and the (002) plane of the hexagonal close-packed structure) of the crystal structure, on which the graphene layer is easily formed. The high quality graphene layer is formed on the catalyst layer.

Figure 8C:
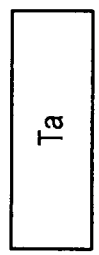
Figure 8D:
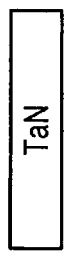
Figure 8E:
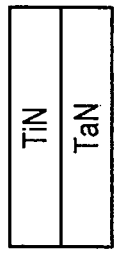

FIG. 8C illustrates a single-layer film of Ta. The Ta film is formed so as to have the amorphous structure. FIG. 8D illustrates a single-layer film of TaN. The TaN film is formed so as to have the face-centered cubic structure. FIG. 8E illustrates a stacked film of the TaN film and the TiN film. The TaN film and the TiN film are formed so as to have the face-centered cubic structure.

The catalyst layer 50 is formed on the co-catalyst layer 40 made of the above materials such that the (111) plane of the face-centered cubic structure of the catalyst layer 50 is oriented so as to be parallel to the surface of the semiconductor substrate 10, or such that the (002) plane of the hexagonal close-packed structure is oriented so as to be parallel to the surface of the semiconductor substrate 10. Thereby, the graphene layer 60 may easily be formed on the catalyst layer 50.

Therefore, by adopting the structure of co-catalyst/catalyst/graphene of the embodiment, the electron scattering in a defect portion can be suppressed even if the device element further miniaturizes, thereby the semiconductor device comprising a graphene having a high quality with lower resistivity than ever before can be realized.

The following merits can be obtained by adopting the structures capable of orienting the co-catalyst layer and the catalyst layer which are mentioned in the first and second embodiments.

A first merit is that the number of defects of the grown graphene can decrease, and therefore a domain of the graphene can enlarge.

A second merit is that the structures of the first and second embodiments are useful for controlling a starting point of the graphene growth. Particularly, in the case that the growth is performed at a temperature of 600° C. or the like, it is considered that the graphene is grown from not the surface of the catalyst layer but an edge portion of a facet of the catalyst layer. For example, the (100) plane and the (110) plane of the face-centered cubic structure are relatively stably formed as an angle of a facet edge face with respect to the catalyst surface oriented toward a (111) of the face-centered cubic structure. The facet face is easily matched by controlling the orientation of the catalyst layer. Basically, the graphene layer is easily formed only by existence of convex and concave, and the angle of the graphene layer is relatively homogenized by matching the orientation of the catalyst layer with the orientation of the co-catalyst layer. For example, the characteristic angles are about 34.5 degrees [an angle formed by the (111) plane and the (110) plane)] and 54.7 degrees [an angle formed by the (111) plane and the (100) plane)] with respect to the (110) plane and the (100) plane, respectively. For this point of view, it is necessary to control the orientation of the catalyst layer on the co-catalyst layer (underlying layer).

In the first and second embodiments, the process is performed after the catalyst layer and the graphene layer are formed on the co-catalyst layer. Alternatively, the graphene layer may be formed after the catalyst layer on the co-catalyst layer is processed. Furthermore, the wiring having a damascene structure may be formed, and then the co-catalyst layer, the catalyst layer, and the graphene layer may be formed, in an addition, the insulating film or the metallic film may be formed as the protective film of the graphene layer, and thereafter, excess films out of the wiring may be removed to form the wiring.

Third Embodiment

In the first and second embodiments, the semiconductor device comprising the wiring (RIE wiring) formed by RIE method are explained. In the present embodiment, a semiconductor device comprising a wiring (damascene wiring) formed by damascene method are explained.

First the structure in FIG. 4 is formed similarly to the first embodiment.

Then, as illustrated in FIG. 10, a stopper film 85 that acts as a stopper in forming a trench, and an inter-layer insulator 90 are formed in a region including an inter-layer insulator 20 and a contact plug 30. The stopper film 85 is, for example, a SiN film, or a SiCN film. In the present embodiment, the stopper film 85 is the SiN film. The stopper film 85 may be eliminated. The inter-layer insulator 90 may be a single-layer insulating film (for example, a silicon nitride film, or a silicon oxide film), or a stacked-slayer insulating film (for example, a stacked film of the silicon nitride film, and the silicon oxide film).

Then, as illustrated in FIG. 11, the inter-layer insulator 90 is selectively etched by using photo lithography technique and RIE method. Then the stopper film 85 is etched such that the surface of the contact plug 30 is exposed. In this way, the wiring trench is formed.

Then, as illustrated in FIG. 12, a co-catalyst layer 40 is formed so as to cover the upper surface of the inter-layer insulator 90 and a side surface and a bottom surface of the wiring trench. In the present embodiment, the stacked film of the TiN film (upper layer) and the Ti film (lower layer) is used as the co-catalyst layer 40. In this case, as illustrated in FIG. 12, the co-catalyst layer 40 is formed with good step coverage. There is no particular limitation to a shape and an angle of a sidewall of the wiring trench. For example, the angle of the sidewall of the wiring trench is greater than or equal to 90° and less than or equal to 20°. For the low angle, the wiring trench is formed shallow to be able to ensure a trench step. Thereby, a short between the adjacent wirings can be prevented even in the low angle.

Figure 13:
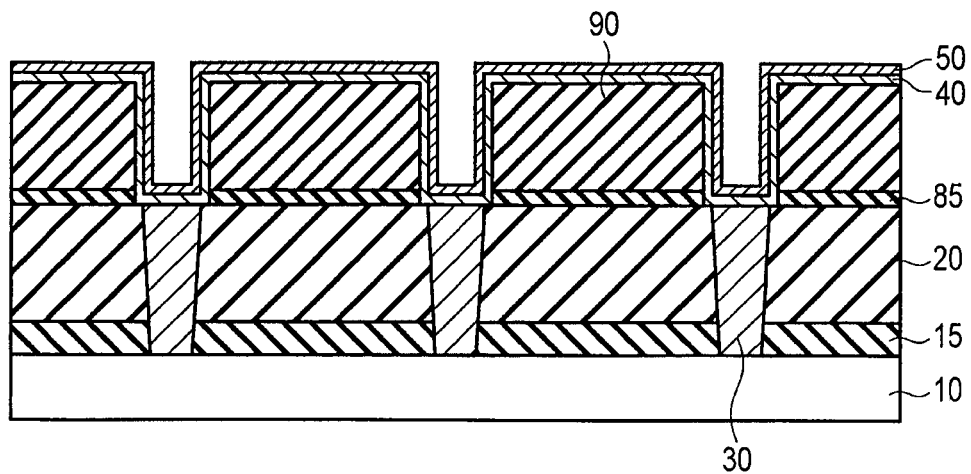
FIG. 13 is a sectional view illustrating the method for manufacturing the semiconductor device following FIG. 12.

Then, as illustrated in FIG. 13, a catalyst layer 50 is formed on the co-catalyst layer 40. The co-catalyst layer 40 may be exposed to an atmosphere between the step of forming the co-catalyst layer 40 and the step of forming the catalyst layer 50. However, from the viewpoint of forming the higher quality catalyst layer 50, desirably the co-catalyst layer 40 is maintained in a vacuum.

Figure 14:
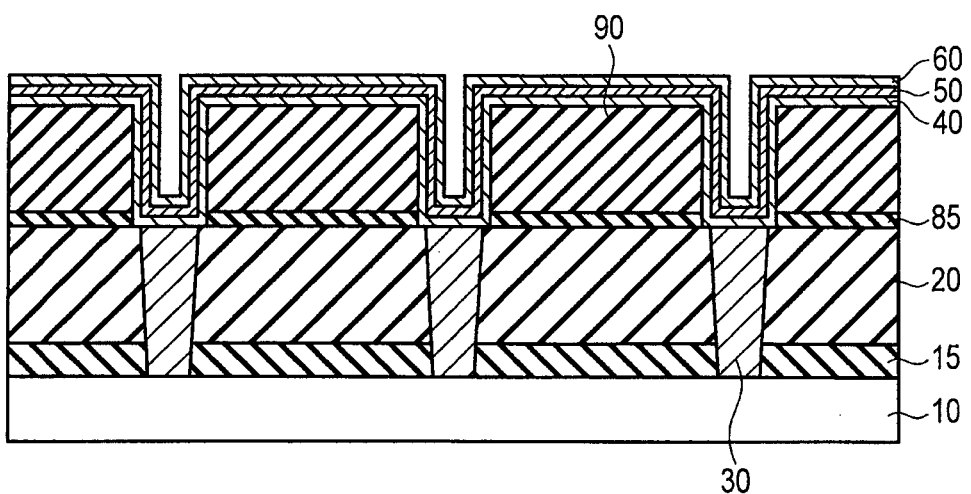
FIG. 14 is a sectional view illustrating the method for manufacturing the semiconductor device following FIG. 13.

Then, as illustrated in FIG. 14, after a pretreatment is performed to the catalyst layer 50, a graphene layer 60 is formed on the catalyst layer 50. For example, the pretreatment is a treatment in which the remote plasma is generated using mixed gases, such as Ar, $H_2$, and $N_2$. The pretreatment is performed at temperatures of 200° C. to 1000° C., for example, at 350° C.

Similarly to the first embodiment, for example, CVD method is adopted as the method for forming the graphene layer 60. In the case that CVD method is adopted, hydrocarbon system gas such as methane, acetylene, or mixed gases thereof may be used as the carbon source, and hydrogen or rare gases are used as a carrier gas. As to the temperature at which the graphene layer 60 is formed, the upper limit is about 1000° C. and the lower limit is about 200° C. As described above, for example, the graphene layer 60 is formed at about 600° C. Furthermore, in order to remove ions and electrons by using the remote plasma, the electrode may be placed above the semiconductor substrate 10, and the voltage is applied to the electrode. As described above, for example, the applied voltage ranges from 0 to ±100 V.

Figure 15:
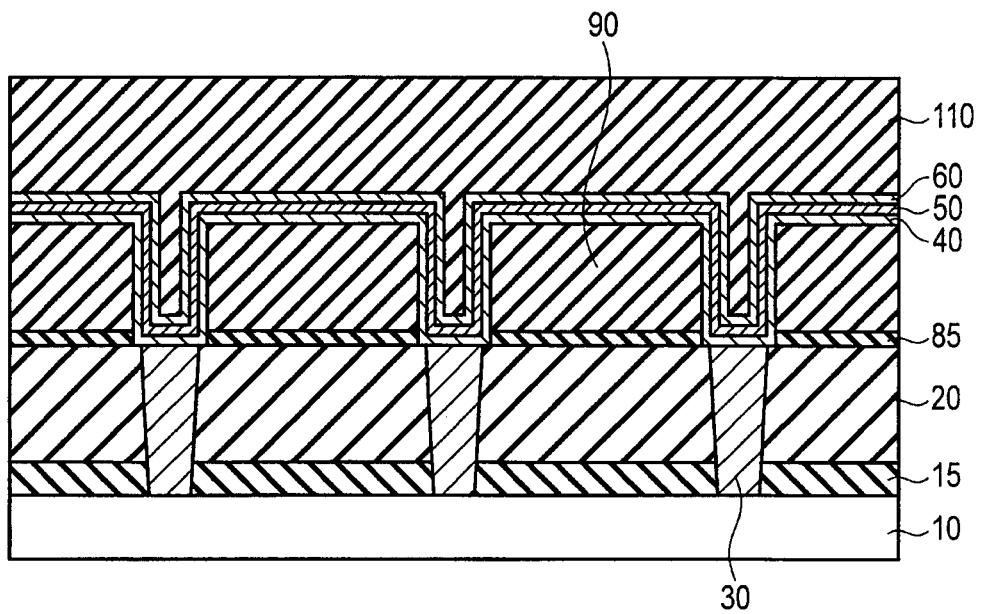
FIG. 15 is a sectional view illustrating the method for manufacturing the semiconductor device following FIG. 14.

Then, as illustrated in FIG. 15, a protective film 110 is formed on the graphene layer 60 such that the wiring trench is filled with the protective film 110. For example, the protective film 110 is an insulating film. In this case, for example, the protective film 110 is formed by CVD method or application method. The protective film 110 may be a metallic film. In this case, for example, the protective film 110 is formed by sputtering method.

Figure 16:
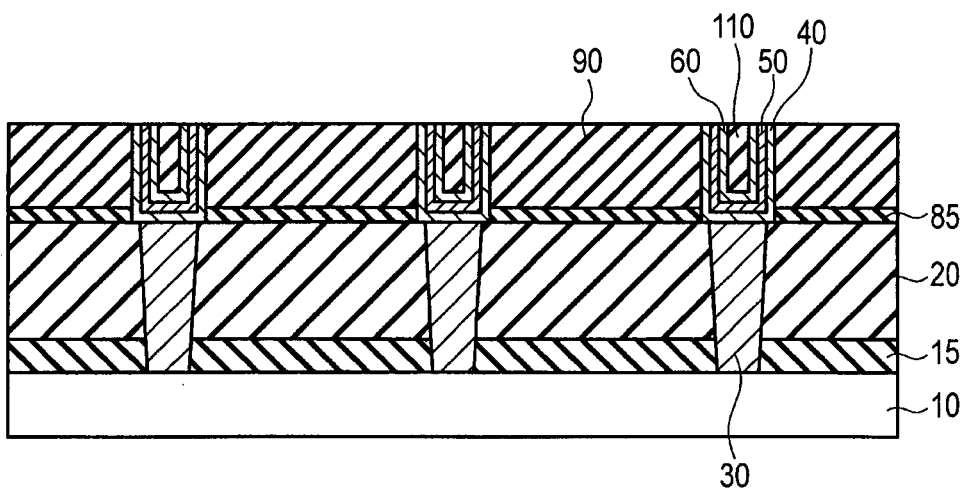
FIG. 16 is a sectional view illustrating the method for manufacturing the semiconductor device following FIG. 15.

Then, as illustrated in FIG. 16, the co-catalyst layer 40, the catalyst layer 50, the graphene layer 60, and the protective film 110, which are located out of the wiring trench, are removed by CMP method to obtain the damascene wiring (the wiring including the co-catalyst layer 40, the catalyst layer 50, and the graphene layer 60).

Figure 17:
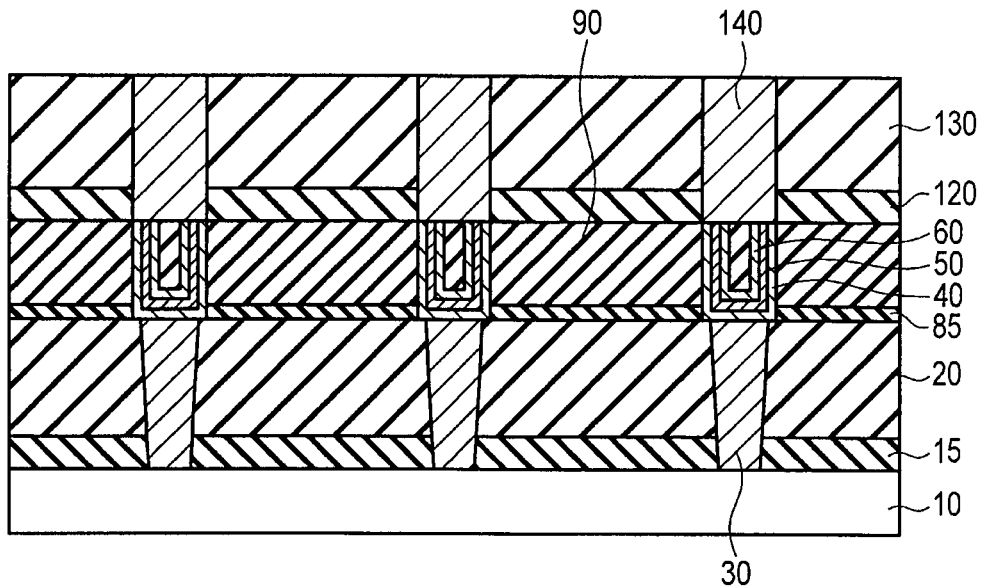
FIG. 17 is a sectional view illustrating the method for manufacturing the semiconductor device following FIG. 16.

Thereafter, the well-known processes are followed. For example, as illustrated in FIG. 17, a step of forming a first inter-layer insulator 120, a step of forming a second inter-layer insulator 130, and a step of forming a wiring (for example, Cu wiring, or W wiring) 140 connected to the damascene wiring are followed.

In the present embodiment, similarly to the first embodiment, the co-catalyst layer 40 on the bottom of the wiring trench has the face-centered cubic structure or the hexagonal close-packed structure, or the amorphous structure or the microcrystalline structure. When the co-catalyst layer 40 has the face-centered cubic structure, or the hexagonal close-packed structure, the co-catalyst layer 40 is formed such that the (111) plane of the face-centered cubic structure, or the (002) plane of the hexagonal close-packed structure is oriented in parallel to the surface of the semiconductor substrate 10.

Moreover, in the present embodiment, similarly to the first embodiment, the catalyst layer 50 on the co-catalyst layer 40 has the face-centered cubic structure, or the hexagonal close-packed structure. When the catalyst layer 50 has the face-centered cubic structure, or the hexagonal close-packed structure, the catalyst layer 50 is formed such that the (111) plane of the face-centered cubic structure, or the (002) plane of the hexagonal close-packed structure is oriented in parallel to the surface of the semiconductor substrate 10.

The co-catalyst layer 40 is formed on the bottom of the wiring trench, and the catalyst layer 50 is formed on the co-catalyst layer 40, so that the high quality graphene layer 60 having the low resistivity can be formed on the bottom of the wiring trench. Thereby, even if the device element further miniaturizes, the damascene wiring having the low resistance is realized.

Another damascene wiring using the co-catalyst layer 40 and the catalyst layer 50 of the present embodiment will be described below.

Figure 18:
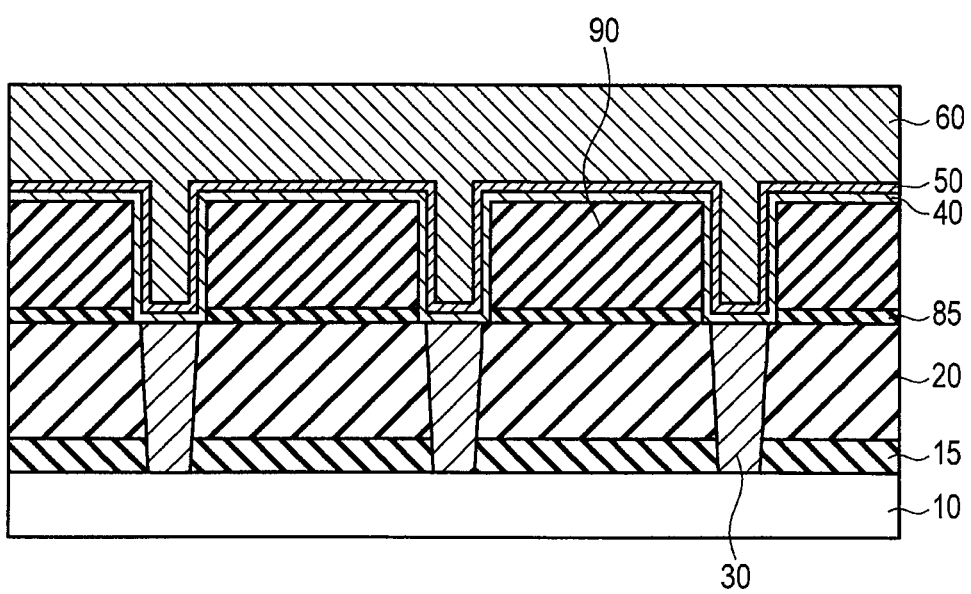
FIG. 18 is a sectional view illustrating a method for forming a damascene wiring using co-catalyst layer, catalyst layer and the graphene layer of an embodiment.

FIGS. 18 and 19 illustrate a process for another damascene wiring which does not use the protective film. In this example, after the step in FIG. 13, the graphene layer 60 is formed such that the wiring trench is filled with the graphene layer 60 (FIG. 18). Then, the co-catalyst layer 40, the catalyst layer 50, and the graphene layer 60 outside of the wiring trench are removed by CMP method to obtain the damascene wiring (FIG. 19).

Figure 21:
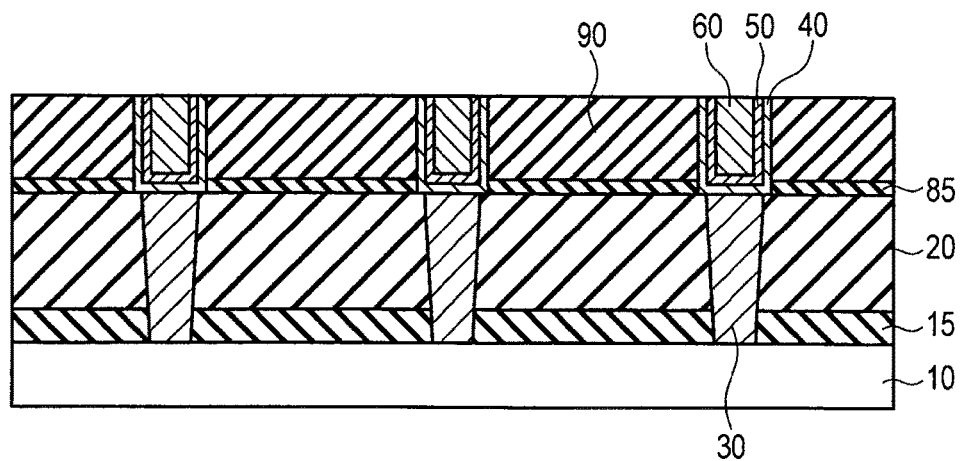
FIG. 21 is a sectional view illustrating the method for forming the damascene wiring following FIG. 20.

FIGS. 20 and 21 illustrate a process for another damascene wiring which uses the protective film. In this example, after the step in FIG. 13, the graphene layer 60 is formed such that the wiring trench is filled with the graphene layer 60, and then the protective film 110 is formed on the graphene layer 60 (FIG. 20). Then, the co-catalyst layer 40, the catalyst layer 50, the graphene layer 60, and the protective film 110 outside of the wiring trench are removed by CMP method to obtain the damascene wiring (FIG. 21). A chemical solution treatment, RIE method, or down-flow etching method may be used instead of CMP method, or chemical solution treatment, RIE method, down-flow etching method, and CMP method may properly be combined.

The damascene wiring of the present embodiment is connected to the contact plug 30 of the lower layer. Alternatively, the damascene wiring may be connected to the wiring (damascene wiring or RIE wiring) of the lower layer. Moreover, the present embodiment can also be applied to a wiring (dual damascene wiring) formed by dual damascene method.

Fourth Embodiment

In the first embodiment, the co-catalyst layer 40 is oriented such that the (111) plane of the face-centered cubic structure is parallel to the surface of the semiconductor substrate 10 in the case that the co-catalyst layer 40 has the face-centered cubic structure, and the co-catalyst layer 40 is oriented such that the (002) plane of the hexagonal close-packed structure is parallel to the surface of the semiconductor substrate 10 in the case that the co-catalyst layer 40 has the hexagonal close-packed structure. A treatment (pre-treatment), which is performed to obtain the characteristic (orientation) in a more desirable form before the graphene layer is formed, will be described in the present embodiment.

Figure 22:
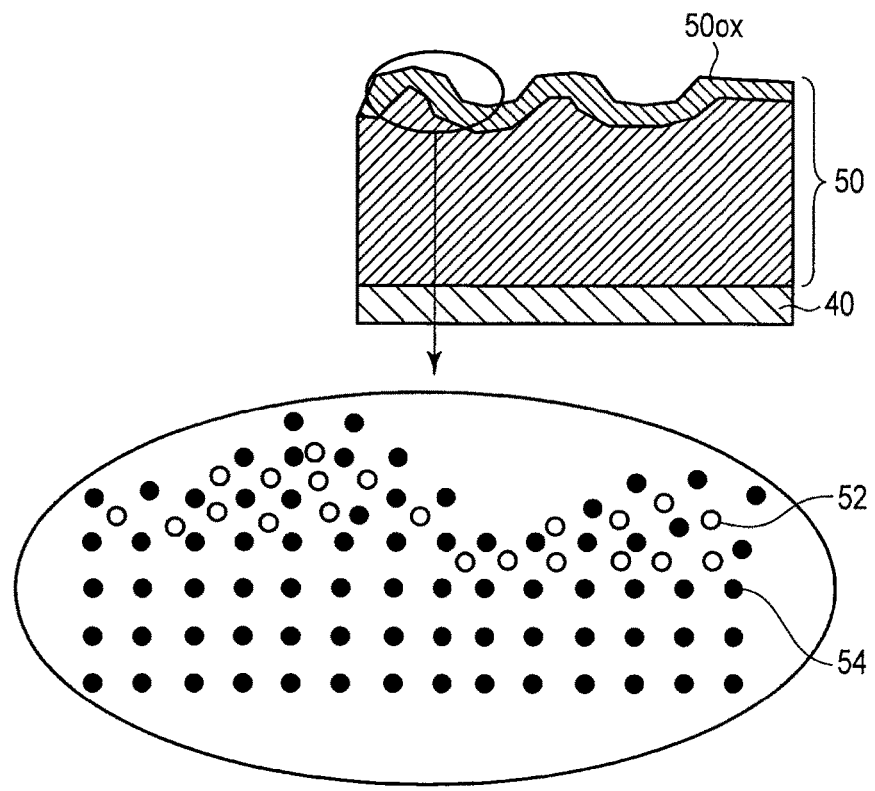
FIG. 22 is a view schematically illustrating the catalyst layer with a surface oxidized.
Figure 23:
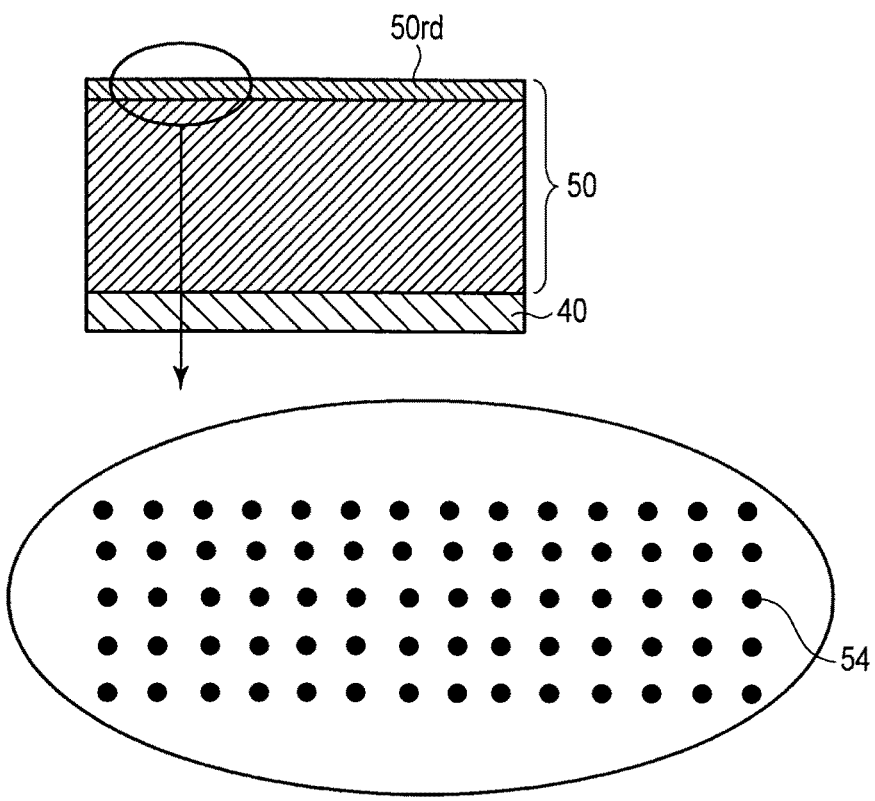
FIG. 23 is a view schematically illustrating the catalyst layer with surface oxidized and reduced.

FIG. 22 is a view schematically illustrating a catalyst layer 50 (a catalyst layer 50 to which an oxidizing treatment is already performed) in the case that the surface of the catalyst layer 50 is oxidized after the catalyst layer 50 made of Co is formed on a co-catalyst layer 40. FIG. 22 also illustrates an enlarged portion of oxidized region 50ox on the surface of the catalyst layer 50. In FIG. 22, the numeral 52 schematically designates oxygen, and the numeral 54 schematically designates an element constituting the catalyst layer. FIG. 23 is a view schematically illustrating the catalyst layer 50 in the case that the catalyst layer 50 with the surface having the oxidizing treatment done in FIG. 22 is reduced. FIG. 23 also illustrates an enlarged portion of oxidized and reduced region 50rd on the surface of the catalyst layer 50.

Roughness exists in the surface of the catalyst layer 50 due to an influence at the time of forming the catalyst layer 50 such as temperature. As a result, the (111) plane of the face-centered cubic structure, or the (002) plane of the hexagonal close-packed structure of the catalyst layer 50, which is obtained while the orientation is controlled like the first embodiment, i.e. the surface well matched with carbon, does not always emerge in a flat manner.

Therefore, there is a case that the graphene layer having the large domain cannot be formed on the intentionally-oriented surface of the catalyst layer 50. Accordingly, it is necessary for the oriented surface of the catalyst layer 50 to expose its atomic plane as a flat plane (a plane parallel to the surface of the co-catalyst layer 40) as much as possible.

Hence, in the present embodiment, the catalyst surface is intentionally oxidized for the purpose of the surface planarization, and then the reduction treatment is forcedly performed.

Generally, in the case that the concave and convex exists in the surface of the metal, a local oxidizing reaction progresses microscopically such that the surface is planarized. The reduction treatment is performed after the oxidizing treatment is intentionally performed once by utilizing the local oxidizing reaction, so that the flat catalyst surface can be obtained. For example, the reducing agent is hydrogen, or ammonia.

Here, as to the oxidizing treatment, a method for exposing the surface of the catalyst layer 50 to $O_2$, or a method for heating and oxidizing the catalyst layer 50 in an oxidizing atmosphere may be adopted.

Alternatively, the following oxidizing treatment and reduction treatment may be performed. That is, after the catalyst layer 50 is formed in the apparatus, the catalyst layer 50 in the apparatus is exposed to the atmosphere, and the reduction treatment and the formation of the graphene layer may continuously be performed in the same apparatus.

The reduction treatment is performed at a temperature at which migration is generated in the catalyst, for example, at 600° C. Thereby, the orientation plane having the better flatness can be exposed.

Moreover, when the reduction treatment is performed at a given temperature (for example, 600° C.) or more, the migration is promoted, then a heat-resistant property may be required for the catalyst. In this case, a refractory metal is selected as the material for the catalyst layer 50. The catalyst layer 50 made of the refractory metal has a function of suppressing aggregation of the catalyst. Accordingly, the use of the catalyst layer 50 made of the refractory metal can form the better graphene layer.

Fifth Embodiment

In the present embodiment, structures of the catalyst layer and the co-catalyst layer, which further improve the heat-resistant property while highly orienting the catalyst layer, and processes of forming catalyst layer and the co-catalyst layer will be described.

The graphene layer is formed on the catalyst layer. In this case, for example, the graphene layer is formed at temperatures of about 200° C. to about 1000° C. In the case that the graphene layer is formed at a low temperature, the graphene layer is frequently formed at around 600° C. In forming the graphene layer, it is important that the catalyst layer be kept thin while the aggregation of the catalyst layer is suppressed.

Figure 24:
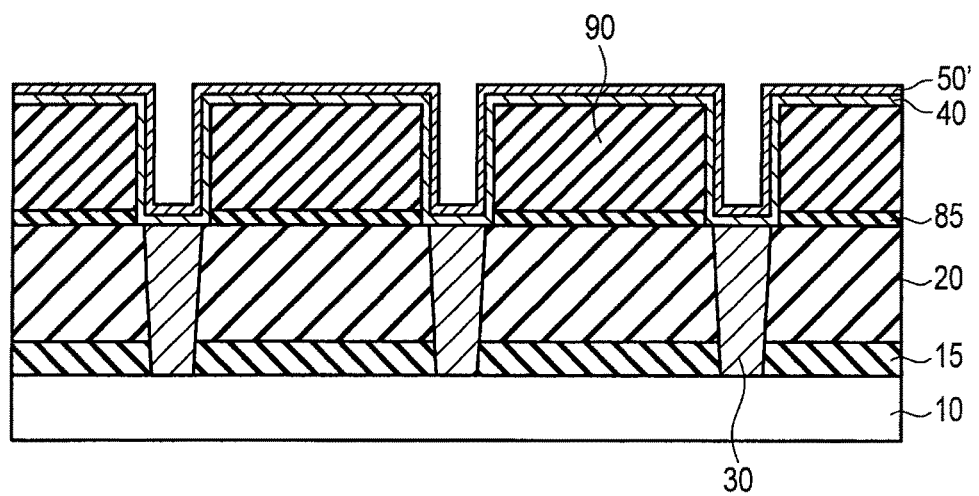
FIG. 24 is a sectional view illustrating a method for manufacturing a semiconductor device according to a fourth embodiment.

In the present embodiment, after the step in FIG. 12 of the third embodiment, a catalyst layer 50' is formed on a co-catalyst layer 40 as illustrated in FIG. 24. The catalyst layer 50' of the present embodiment contains a first material and a second material. The first material is the above-described material (catalyst element) for the catalyst layer 50. A second material is an element (additive element), which has a melting point higher than that of the catalyst element and forms the complete solid solution with the catalyst element, or an element (additive element), which has a melting point higher than that of the catalyst element and forms an eutectic with the catalyst element.

The catalyst layer 50' is obtained such that the catalyst element and the second material are simultaneously deposited by co-sputtering method.

Alternatively, the catalyst layer 50' may be formed by sputtering method using an alloy target containing the first material (catalyst element) and the second material (additive element).

Alternatively, the catalyst layer 50' may be formed by CVD method using source gas containing the first and second materials.

Alternatively, the catalyst layer 50' may be obtained as follows. The co-catalyst layer 40 containing the second material is formed, the catalyst layer 50 is formed on the co-catalyst layer 40, and the second material is diffused from the co-catalyst layer 40 into the catalyst layer 50 by heat treatment. In this case, a co-catalyst layer having the stacked structure may be used as the co-catalyst layer 40, wherein the stacked structure may be configured to enhance the orientation of the catalyst (Co) as much as possible. For example, the stacked film of Ta/Ru/Ir/Co may be used.

Moreover, the catalyst layer 50' may be a catalyst layer having a multilayer structure in which a first catalyst layer containing the first material and a second catalyst layer containing the second material are alternately stacked. In this case, the first catalyst layer may be formed by ALD (Atomic Layer Deposition) using source gas containing the first material, and the second catalyst layer is formed by ALD method using source gas containing the second material.

Either the first catalyst layer or the second catalyst layer may be used as the lowermost layer of the catalyst layer 50'.

Similarly, either the first catalyst layer or the second catalyst layer may be used as the uppermost layer of the catalyst layer 50'.

Additionally, the catalyst layer having the multilayer structure may be changed into the catalyst layer in which the first catalyst layer and the second catalyst layer are homogenized, by performing the heat treatment to the catalyst layer having the multilayer structure.

Thereafter, for example, as illustrated in FIG. 25, a wiring having the structure in which the wiring trench is filled with the co-catalyst layer 40, the catalyst layer 50', a graphene layer 60, and a protective film 110 (the insulating film or the metallic film) may be formed, or as illustrated in FIG. 25, the wiring having the structure in which the wiring trench is filled with the co-catalyst layer 40, the catalyst layer 50' and the graphene layer 60, as illustrated in FIG. 25 may be formed. The wiring shown in FIG. 25 is, for example, formed by the method described with reference to FIGS. 15 and 16. The wiring shown in FIG. 26 is formed, for example, by the method described with reference to FIGS. 18 and 19.

The catalyst layer 50' of the present embodiment includes the first and second materials, so that the melting point of the catalyst layer 50' can be raised compared with the catalyst layer 50 of the embodiment that does not contain the second material. The aggregation is hardly generated in the catalyst layer having the high melting point. Therefore, the catalyst layer 50' can be formed thinner than the catalyst layer 50. The microfabrication of the wiring including the graphene layer is easily performed using the catalyst layer 50'.

The effective element (second material) contained in the catalyst layer 50' is a eutectic element, desirably a complete-solid-solution element, which do not form a compound with the catalyst layer 50 (first material).

For example, in the case that the first material is Ni, the eutectic element (second material) is Cr, Tc, Ru, Ox, Re, or C, and the complete-solid-solution element (second material) is Pd, Pt, Rh, or Ir.

Moreover, in the case that the first material is Co, the eutectic element (second material) is C, and the complete-solid-solution element (second material) is Pd, Pt, Rh, Ru, Ir, Os, or Re.

Furthermore, in the case that the first material is Fe, the eutectic element (second material) is Ru, Cd, or C, and the complete-solid-solution element (second material) is Cr, Rh, Ir, or W.

As described in the first embodiment, in order to maintain the desirable lattice mismatch degree between the catalyst layer and the graphene layer, for example, an additive amount of the second material is about 56 atomic % at the most for the lattice mismatch degree of 5%.

At least one refractory metal element (second material) may be added to the catalyst layer 50' in order to improve the heat-resistant property. The catalyst layer 50' may be made of a material (first material) containing at least two elements. For example, the catalyst layer 50' may be made of the alloy that, as described in the above embodiment, is formed to control the lattice matching while containing at least two materials selected from the group consisting Ni, Co, and Fe. In this case, the catalyst layer of the present embodiment comprises the alloy, and the second material (the element raising the melting point) added in the alloy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:

forming a co-catalyst layer above a surface of a semiconductor substrate, the co-catalyst layer comprising a face-centered cubic structure or a hexagonal close-packed structure, or an amorphous structure or a microcrystalline structure, wherein the co-catalyst layer is formed such that a (111) face of the face-centered cubic structure or a (002) face of the hexagonal close-packed structure is to be oriented parallel to the surface of the semiconductor when the co-catalyst layer comprises the face-centered cubic structure or the hexagonal close-packed structure;

forming a catalyst layer on the co-catalyst layer, the catalyst layer comprising a face-centered cubic structure or a hexagonal close-packed structure, or an amorphous structure or a microcrystalline structure, wherein the catalyst layer is formed such that a (111) face of the face-centered cubic structure or a (002) face of the hexagonal close-packed structure is to be oriented parallel to the surface of the semiconductor when the catalyst layer comprises the face-centered cubic structure or the hexagonal close-packed structure, the catalyst layer comprising a portion which contacts the co-catalyst layer, the portion comprising the face-centered cubic structure or the hexagonal close-packed structure, or the amorphous structure or the microcrystalline structure;

planarizing an exposed surface of the catalyst layer by applying an oxidation treatment to the catalyst layer, and by applying a reduction treatment to the catalyst layer to which the oxidation treatment is applied; and forming a graphene layer on the catalyst layer, wherein the catalyst layer further comprises a multilayer structure in which a first material layer and a second material layer are alternately stacked, the first material layer includes a first material as a catalyst, the second material layer includes a second material having a melting point higher than that of the first material, and the second material forms a eutectic with the first material, or the second material forms complete soluble with the first material.

2. The method of claim 1, wherein the first material is one selected from a group consist of Ni, Co, and Fe, or a nitride of the material selected from the group, or an alloy including at least two materials selected from the group.

3. The method of claim 2, wherein the first material is Ni, the second material is Cr, Tc, Ru, Os, Re, or C when the second material forms the eutectic with the first material, and the second material is Pd, Pt, Rh, or Ir when the second material forms the complete soluble with the first material.

4. The method of claim 2, wherein the first material is Co, the second material is C when the second material forms the eutectic with the first material, and the second material is Pd, Pt, Rh, Ru, Ir, Os, or Re when the second material forms the complete soluble with the first material.

5. The method of claim 2, wherein the first material is Fe, the second material is Ru, Cd, or C when the second material forms the eutectic with the first material, and the second material is Cr, Pt, Rh, Ir, or W when the second material forms the complete soluble with the first material.

6. The method of claim 1, wherein the catalyst layer is a laminated film doped with the second material, and the laminated film includes films made of different materials selected from a group consisting of Ni, nitride of Ni, Co, nitride of Co, Fe, and nitride of Fe.

7. The method of claim 1, wherein the co-catalyst layer comprises the second material, and wherein the forming the catalyst layer comprises forming a catalyst layer comprising the first material on the co-catalyst layer, and diffusing the second material from the co-catalyst layer into the catalyst layer.

8. The method of claim 1, wherein the forming the catalyst layer comprises forming a catalyst layer comprising the first material, and doping the catalyst layer with the second material from above the catalyst layer.

9. The method of claim 1, wherein the forming the catalyst layer comprises simultaneously supplying the first and second materials onto the co-catalyst layer.

10. The method of claim 1, further comprising processing the graphene layer, the catalyst layer, and the co-catalyst layer into a wiring.

11. The method of claim 1, wherein the oxidization treatment comprises exposing a surface of the catalyst layer to oxygen.

12. The method of claim 1, wherein the oxidization treatment comprises heating the catalyst layer in an oxidizing atmosphere.

13. The method of claim 1, wherein the reduction treatment comprises using hydrogen or ammonia as a reducing agent.

14. The method of claim 1, wherein the oxidization treatment and the reduction treatment are performed in a same apparatus.

15. The method of claim 12, wherein the graphene layer is formed in the same apparatus.

16. The method of claim 1, further comprising forming a protective film on the graphene layer.

* * * * *